(12) United States Patent
Kamata

(10) Patent No.: US 6,480,682 B1
(45) Date of Patent: Nov. 12, 2002

(54) PHOTOMETRIC DEVICE COMPRISING A PHOTO SENSOR MOUNTED ON A CIRCUIT BOARD

(75) Inventor: Kazuo Kamata, Kanagawa (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 5 days.

(21) Appl. No.: 09/653,863

(22) Filed: Sep. 1, 2000

(30) Foreign Application Priority Data

Sep. 29, 1999 (JP) .......................... 11-250490
Sep. 29, 1999 (JP) .......................... 11-277235

(51) Int. Cl.[7] .................. G03B 17/02; G03B 17/00; G03B 15/03; G03B 7/099
(52) U.S. Cl. .................. 396/542; 396/6; 396/176; 396/268; 396/274
(58) Field of Search .................. 396/6, 176, 542, 396/268, 274

(56) References Cited

U.S. PATENT DOCUMENTS

| | | | |
|---|---|---|---|
| 5,628,039 A | | 5/1997 | Muramatsu et al. ........ 396/296 |
| 5,748,448 A | * | 5/1998 | Hokari ..................... 361/749 |
| 6,112,034 A | * | 8/2000 | Takao et al. ................ 396/542 |
| 6,117,193 A | * | 9/2000 | Glenn ....................... 29/25.01 |
| 6,233,403 B1 | * | 5/2001 | Aratame et al. .............. 396/6 |
| 2001/0026686 A1 | * | 10/2001 | Ito ............................ 396/440 |

* cited by examiner

Primary Examiner—Russell Adams
Assistant Examiner—Melissa J Koval
(74) Attorney, Agent, or Firm—Young & Thompson

(57) ABSTRACT

A photometric device is constituted of a photometric window, a circuit board behind the photometric window, a photo sensor mounted on the circuit board with its photoreceptive surface oriented toward the photometric window, and a mask member placed between the photometric window and the photoreceptive surface of the photo sensor. The mask member has a plurality of round holes to conduct light from the photometric window to the photoreceptive surface. The photoreceptive surface and the photometric window have the same diameter. The holes have a diameter of 1 mm and an axial length of 8 mm that is equal to the thickness of the mask member. The holes are arranged closely in a honeycomb pattern within an area equal to the photoreceptive surface, so a sufficient amount of light falls on the photoreceptive surface in total.

13 Claims, 11 Drawing Sheets

PHOTOMETRIC DEVICE COMPRISING A PHOTO SENSOR MOUNTED ON A CIRCUIT BOARD

BACKGROUND OF THE INVENTION

1. Field of the Invention

The present invention relates a photometric device incorporated in a camera, especially in a lens-fitted photo film unit, for measuring subject brightness, and a method of mounting a photo sensor on a circuit board, especially on a flash circuit board in a lens-fitted photo film unit, for measuring subject brightness.

2. Background Arts

A variety of lens-fitted photo film units have been widely known as a kind of single-use camera that contains an unexposed photo film cartridge and have simple mechanisms for taking photographs. Among the lens-fitted photo film units, hereinafter called simply the film units, those with a flash device have been widely used.

The flash device of the film unit is constituted of a printed circuit board and circuit elements mounted on the board. To facilitate assembling the flash device at a low cost and accommodating it compactly in the unit body, the circuit elements are integrally mounted on one side of the circuit board, and are connected to each other through printed circuit or printed wiring made of copper foil formed on the other side of the board. That is, terminals of the circuit elements are put from the mounting side through the circuit board, and are concurrently connected to the printed circuit by reflow-soldering or the like. Thereby, the circuit elements are secured to the circuit board at the same time. The circuit board of the flash device, hereinafter called the flash circuit board, is located between a body basic portion and a front cover of the film unit, with its mounting side oriented to the body basic portion, so that the circuit elements are accommodated in a recess between a film roll chamber and an exposure chamber of the body basic portion. Accordingly, the other side of the flash circuit board having the printed circuit thereon, hereinafter referred to as the print side, is oriented forward and opposed to an inside surface of the front cover.

Since the film unit is expected to be provided at a low price, the shutter speed and the aperture size of the film unit are fixed to simplify the photographic mechanism and thus reduce the production cost. Therefore, under- or over-exposure is likely to occur in the film unit. In order to produce photo-prints of acceptable exposure conditions from those over- or under exposed negatives, amount of printing light is controlled in a compensating way. However, it is impossible to deal with extremely over- or under-exposed negatives even by the exposure correction in printing.

To solve this problem, a simple automatic exposure control device the film unit has been studied in the art, that switches the shutter speed or the aperture size between two values based on a threshold value of subject brightness. Just changing the shutter speed or the aperture size between two values makes it possible to photograph most scenes with such exposure conditions that are correctable to make prints with acceptable exposure conditions by adjusting the printing light.

To measure the subject brightness, the automatic exposure control device needs a photometric device. In terms of space efficiency and wiring, it is preferable to form a circuit of the exposure control device on the flash circuit board and mount a photo sensor, such as a CdS cell, on the flash circuit board by soldering. However, as described above, the mounting side of the flash circuit board is oriented rearward to the body basic portion of the film unit, so the photo sensor cannot be mounted on the mounting side in the same way as other circuit elements of the flash device, because a photo-receptive face of the photo sensor would be directed inward in that case. It is possible to mount the photo sensor on the body basic portion or the front cover with its face directed outward, and connect it through lead wires or the like to the exposure control circuit on the flash circuit board. However, because this solution needs complicated wiring, production efficiency as well as space efficiency would be lowered, and thus the production cost would be raised.

On the other hand, a film unit with a taking lens of a long focal length has also been known as a telephoto type film unit. The telephoto type film unit is disclosed for example in U.S. Pat. No. 5,628,039. Because the telephoto type film unit is designed to focus on a distant range way beyond reach of the small flash device of the film unit, the telephoto type film unit does not usually have the flash device. Therefore, the lower limit of subject brightness for the telephoto type film unit to photograph with acceptable or correctable exposure conditions is higher than the lower limit for a film unit of a standard focal length, e.g. 32 mm, and with a flash device.

Accordingly, it has been considered to provide the telephoto type film unit with a low brightness warning function for warning the photographer when the subject brightness is below a level predetermined in accordance with the film speed, for the sake of avoiding extreme under-exposure. Also in this case, a photometric device must be mounted on the film unit.

In either case, it is necessary to measure the subject brightness in an area within a photographic field of the taking lens. Since the field angle of the long-focal length taking lens is remarkably narrower than that of the standard focal length lens, the photometric area and thus the acceptance angle of the photo sensor for the telephoto type should also be set narrower. For example, to define the photometric area of the photo sensor to be approximately ⅔ of the photographic field of the taking lens in a telephoto type film unit where the focal length is 120 mm and the contained photo film cartridge is of 135 type whose effective frame size is 22.5 mm in the short side, the acceptance angle on the photo sensor should be 7.125 degrees. This acceptance angle is about ¼ compared to that suitable for a standard film unit where the focal length is 32 mm and the film is of 135 type.

To define the acceptance angle on the photoreceptive face of the photo sensor, a mask plate with a hole for limiting the incident light is placed in front of the photo sensor. The acceptance angle on the photo sensor may be defined by the diameter of the hole and the thickness of the mask plate, i.e. the depth of the hole. To obtain the above acceptance angle of 7.125 degrees, the depth-to-diameter ratio is 1:8.

Where the photoreceptive face of the photo sensor has a diameter of 6 mm, and the diameter of the hole of the mask plate is 6 mm, the depth of the hole should be 48 mm according to the above depth-to-diameter ratio. However, taking account of the mounting space for the photo sensor in the unit body, the depth of the hole should not be more than 8 mm. Where the depth of the hole is 8 mm, the diameter of the hole must be 1 mm, according to the above depth-to-diameter ratio. In that case, the amount of light falling on the photo sensor would be too small to measure the subject brightness reliably.

SUMMARY OF THE INVENTION

In view of the foregoing, an object of the present invention is to provide a method of mounting a photo sensor on a circuit board of a camera in a compact fashion at a low cost without the need for labor-consuming wiring, such that the photo sensor can measure subject brightness, wherein the circuit board has a print side with circuits printed thereon, and is mounted in the camera with the print side oriented toward an object side of a taking lens of the camera, and circuit elements are mounted on a mounting side of the circuit board that is opposite to the print side. The photo sensor has a photoreceptive surface on its front face, and a pair of terminals extending rearward from the photo sensor Another object of the present invention is to provide a photometric device that is mounted in a film unit in a compact fashion at a low cost.

A further object of the present invention is to provide a photometric device wherein a sufficient amount of light enough for reliable photometry falls on a photo sensor of the photometric device at a very small acceptance angle.

According to an aspect of the invention, the photo sensor is mounted on the circuit board by putting the terminals through the circuit board from the print side to the mounting side; bending the terminals, after being protruded rearward from the mounting side, toward the circuit board; putting the bent terminals through the circuit board from the mounting side, to protrude tips of the terminals from the print side; and soldering the tips of the leading terminals on the printed circuits on the print side.

It is also possible to mount the photo sensor on the circuit board by forming an opening through the circuit board; putting the photo sensor on the mounting side of the circuit board, so as to expose the photoreceptive face through the opening; thereafter bending the terminals toward the circuit board; putting the bent terminals through the circuit board from the mounting side, to protrude tips of the terminals from the print side; and soldering the tips of the leading terminals on the printed circuits on the print side.

A photometric device of the invention comprises:
a photo sensor having a photoreceptive surface;
a photometric window formed in front of the photoreceptive surface; and
a mask member provided between the photometric window and the photoreceptive surface, with a constant thickness in an axial direction perpendicular to the photoreceptive surface, the mask member having a plurality of smaller holes than the photoreceptive surface, that are formed through from a front side that is exposed through the photometric window to a rear side that is opposed to the photoreceptive surface.

The acceptance angle on the photoreceptive surface is reduced by reducing the size of each hole where the thickness of the mask member in the axial direction is constant, while the total amount of light falling on the photoreceptive surface through the mask member is increased by increasing the number of holes of the mask member within an area corresponding to the photoreceptive surface.

BRIEF DESCRIPTION OF THE DRAWINGS

The above and other objects and advantages of the present invention will become apparent from the following detailed description of the preferred embodiments when read in association with the accompanying drawings, which are given by way of illustration only and thus are not limiting the present invention. In the drawings, like reference numerals designate like or corresponding parts throughout the several views, and wherein.

DETAILED DESCRIPTION OF THE EMBODIMENTS

Figure 1:
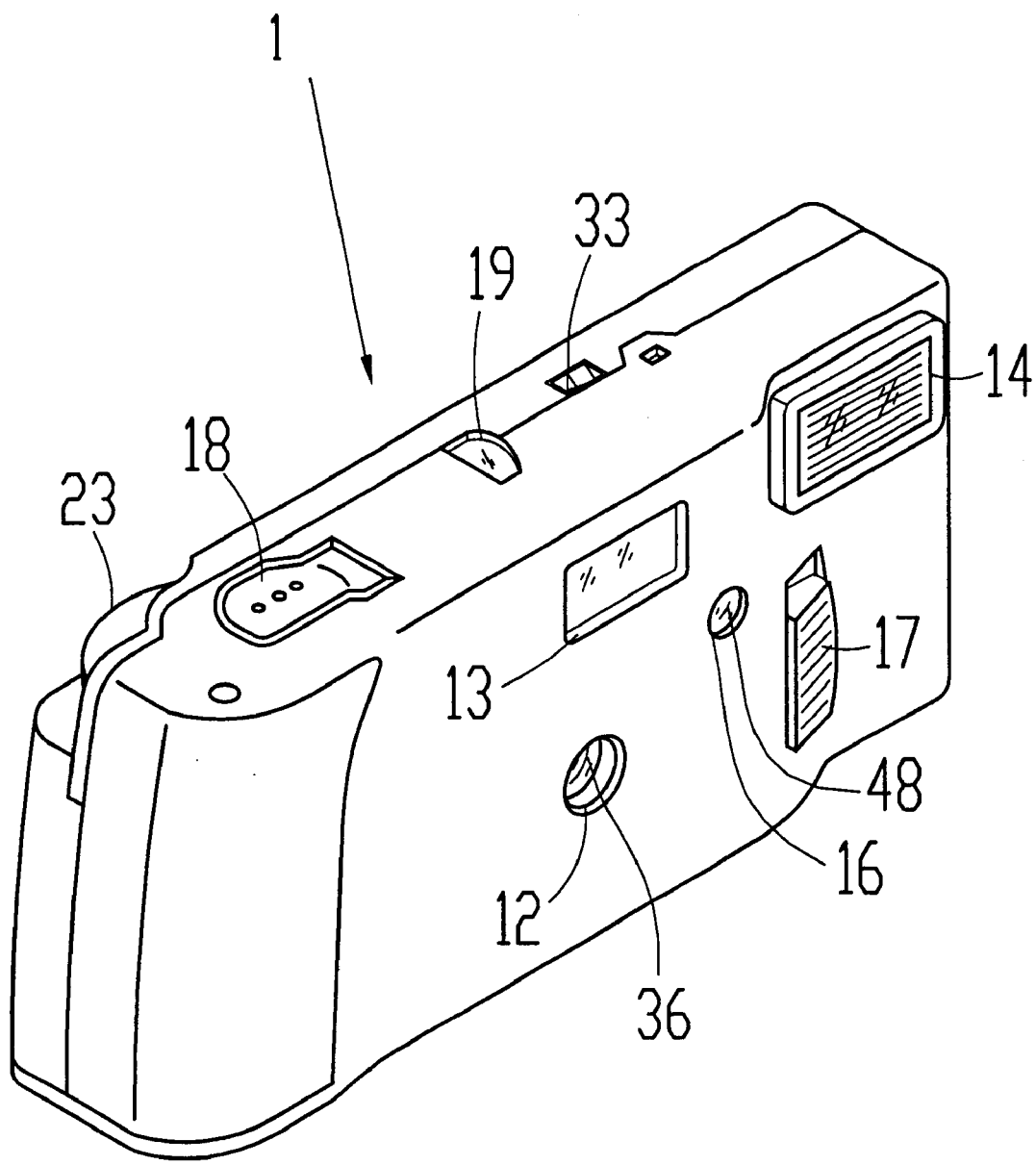
FIG. 1 is a perspective view of a lens-fitted photo film unit with an automatic exposure control device according to an embodiment of the invention.
Figure 2:
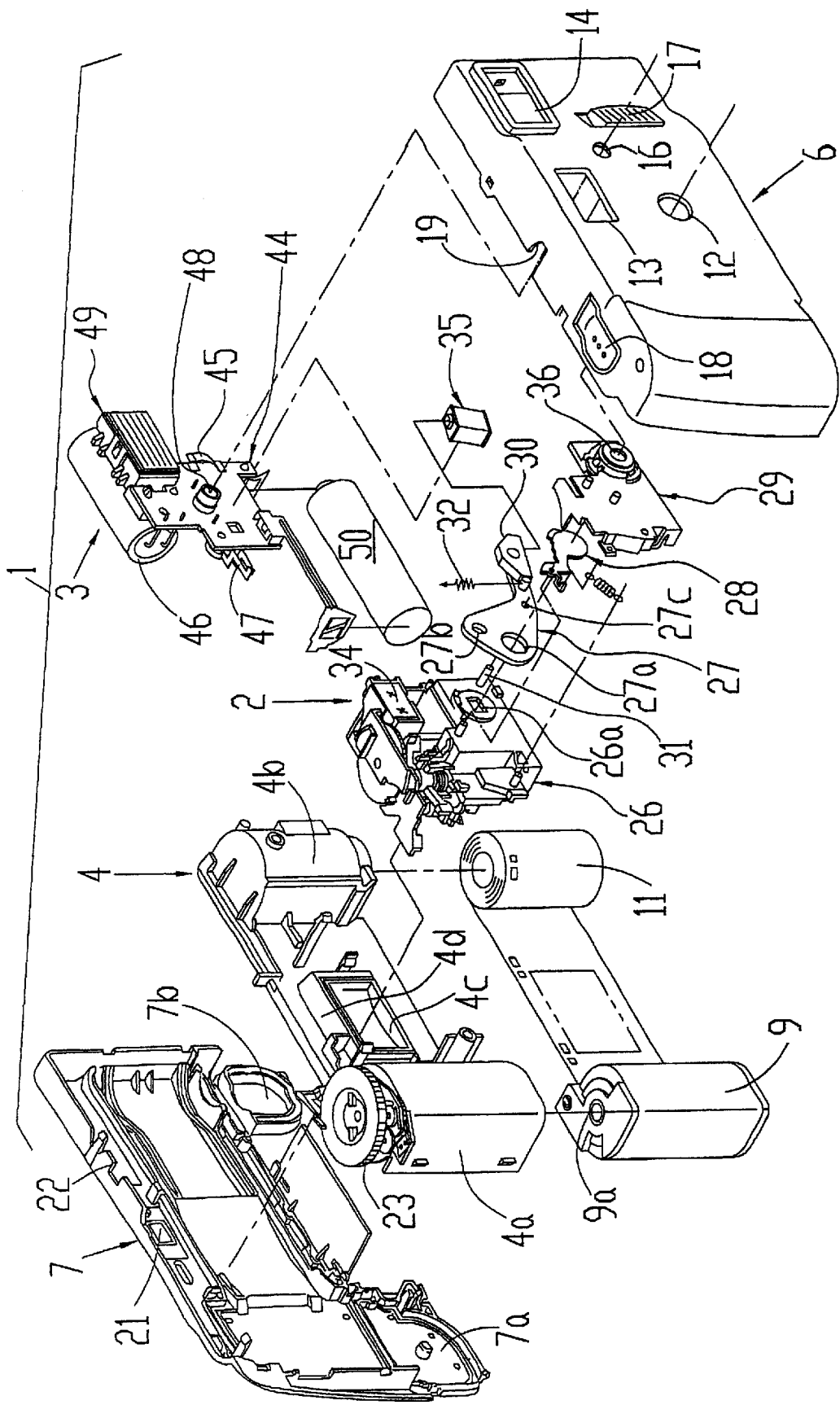
FIG. 2 is an exploded perspective view of the film unit of FIG. 1.

A. film unit 1 shown in FIGS. 1 and 2 is mainly constituted of a body basic portion 4, a photographic unit 2, a flash device 3, a front cover 6, a rear cover 7, a cartridge shell 9 and a roll of unexposed photo filmstrip 11 that is drawn out from the cartridge shell 9. The cartridge shell 9 and the roll of the filmstrip 11 are placed in a cartridge chamber 4a and a film chamber 4b of the body basic portion 4 which are formed on opposite sides of an exposure aperture 4c. The photographic unit 2 is attached to the front of the exposure aperture 4c, and the flash device 3 is attached to the front of the film chamber 4b, wherein "front" is the object side of a taking lens 36 in the film unit 1. Thereafter, the front and rear covers 6 and 7 are attached to the body basic portion 4.

On a front wall of the front cover 6, there are formed an exposure window 12 for the taking lens 36, a finder objective window 13 for a finder optical system 34, a flash window 14 for a flash projector 49, and a photometric window 16 for a photo sensor 48. On a top wall of the front cover 6, there are formed a shutter button 18 and a frame counter window 19. A power switch 17 is mounted beside the photometric window 16.

The rear cover 7 is formed with a finder eyepiece window 21, a flash charge indication window 22, and bottom lids 7a and 7b for light-tightly closing open bottoms of the cartridge chamber 4a and the film chamber 4b.

A film winding wheel 23 is mounted on atop the cartridge chamber 4b, and is engaged with a spool 9a of the cartridge shell 9, so the filmstrip 11 may be wound into the cartridge shell 9 by rotating the film winding wheel 23.

The photo sensor 48 is a member of an automatic exposure control device as set forth in detail later. In this embodiment, the photo sensor 48 is made of a well-known CdS cell, a photoconductive element whose resistance varies depending upon brightness of incident light, so the automatic exposure control device switches over the aperture size of the taking lens 36 on the basis of the variation in the resistance of the CdS cell.

The power switch 17 is slid to an upper ON position to start charging the flash device 3. When the flash device 3 is fully charged, a not-shown light emitting element projects light through a light guide 33 out from the flash charge indication window 22. The power switch 17 is also interconnected with a switch for activating the automatic exposure control device to start photometry through the photo sensor 48.

The photographic unit 2 is an assembly wherein photographic mechanisms, such as a shutter mechanism, a lock mechanism and a frame counting mechanism, and the finder optical system 34 are mounted on a base frame 26 that constitutes an exposure chamber when mated with a frame portion 4d surrounding the exposure aperture 4c. A shutter opening 26a is formed on the front of the base frame 26, and a stop blade 27 and a shutter blade 28 are mounted in front of the shutter opening 26a. The stop blade 27 and the shutter blade 28 are covered by a shutter cover 29 that holds the taking lens 36 on its front.

When the shutter button 18 is pressed, the shutter mechanism is released to push the shutter blade 28 to open the shutter opening 26a for a moment for an exposure. The shutter speed is fixed at a predetermined value. The lock mechanism locks the film winding wheel 23 when the shutter mechanism is in a charged condition. When the shutter mechanism is released by pressing the shutter button 18, the film winding wheel 23 is unlocked. In cooperation with the winding of the filmstrip 11, the shutter mechanism is charged for the next exposure. When the filmstrip 11 has been wound up by one frame, the lock mechanism comes to lock the film winding wheel 23.

The stop blade 27 is formed with a large top aperture 27a and a small stop aperture 27b. A pivotal hole 27c of the stop blade 27 is fitted on an axle 31 that is formed on the front of the base frame 26, so that the stop blade 27 may swing between a first position where the small stop aperture 27b is on an optical axis of the taking lens 36, and a second position where the large stop aperture 27a is on the optical axis of the taking lens 36. The stop blade 27 is urged by a spring 32 toward the first position.

An electromagnet 35 is disposed on a circuit board 44 of the flash device 3 that is located on the right side of the base frame 26 in FIG. 2. An iron member 30 is secured to a right end of the stop blade 27 that is on opposite side of the pivotal hole 27c from the apertures 27a and 27b. When the magnetic power of the electromagnet 35 goes above a predetermined level, the iron member 30 is attracted to the electromagnet 35 against the force of the spring 32. Where the iron member 30 is in contact with the electromagnet 35, the stop blade 27 is in the second position. Accordingly, the small stop aperture 27b is usually placed in front of the shutter opening 26a, whereas the large stop aperture 27a is placed in front of the shutter opening 26a only while the electromagnet 35 is activated.

Figures 3A, 3B:
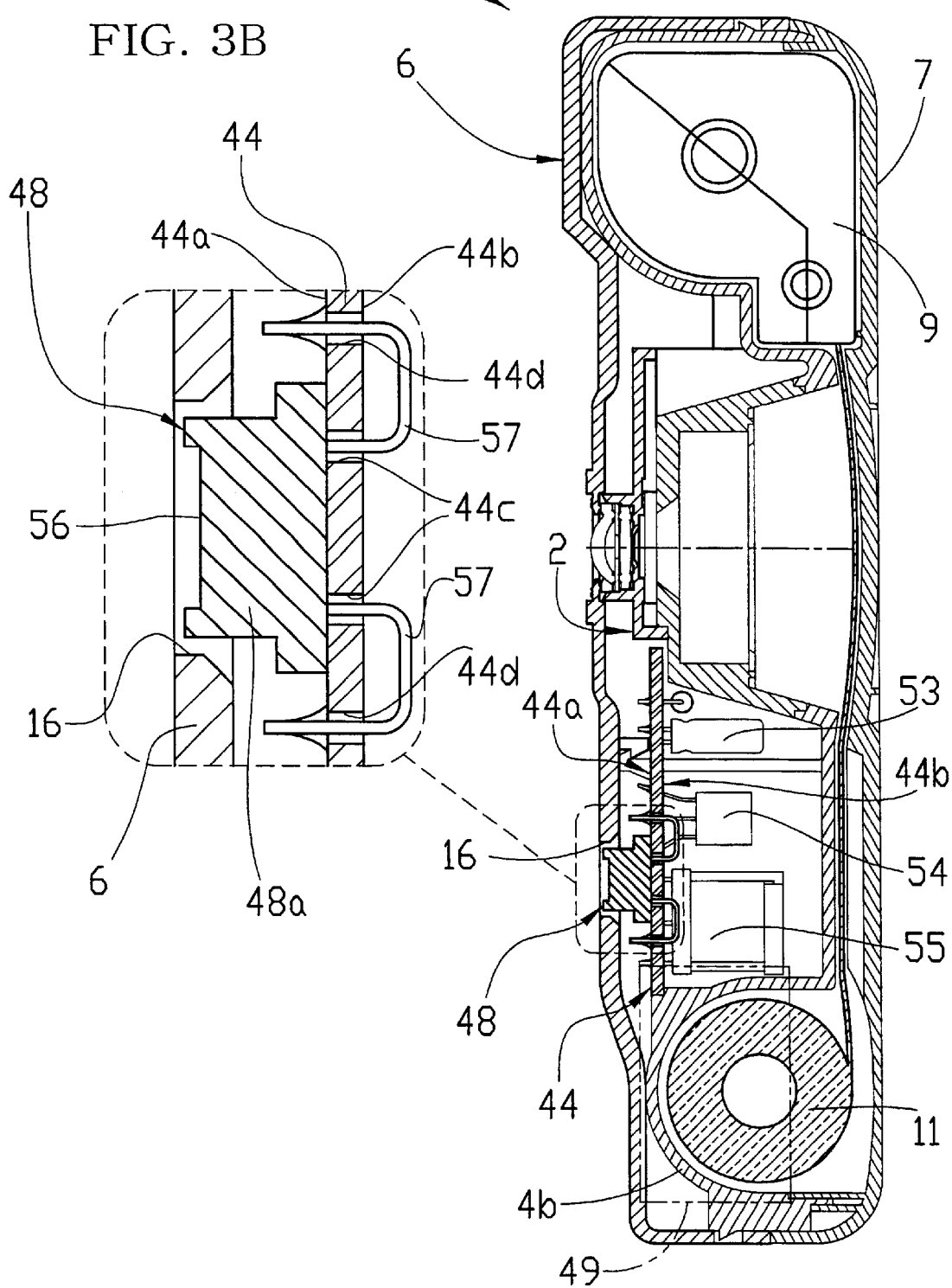
FIG. 3A is a horizontal section of the film unit of FIG. 1.
FIG. 3B is an enlarged sectional view of a photo sensor of the automatic exposure control device, mounted on a flash circuit board of the film unit of FIG. 1.

As shown in FIGS. 2 and 3A, the circuit board 44 of the flash device 3 has circuits printed on a front side 44a, and a main capacitor 46, a synchronized flash trigger switch 47 and other circuit elements, including a capacitor 53, a transistor 54 and a transformer 55, are mounted on a rear mounting side 44b of the circuit board 44. The flash projector 49 and a pair of contact blades for holding a battery 50 are also secured to the circuit board 44.

Beside a flash circuit that charges the main capacitor 46 and discharges the main capacitor 46 through a not-shown flash discharge tube of the flash projector 49, an exposure control circuit is formed on the circuit board 44. The electromagnet 35 and a power switch contact 45 are mounted on the front print side 44a of the circuit board 44. The power switch contact 45 is turned on by sliding the power switch 17 up to the ON position, supplying the flash circuit and the exposure control circuit from the battery 50. The photo sensor 48 is mounted on the front print side 44a of the circuit board 44 in a way as set forth in detail below.

Referring to FIG. 3A, the circuit board 44 extends between the photographic unit 2 and the film chamber 4b substantially in parallel to the front wall of the front cover 6. As shown in detail in FIG. 3B, the photo sensor 48 has a photoreceptive surface 56 is located on a front face of a substantially cylindrical sensor body 48a, whereas a pair of terminals 57 are protruded axially from a rear end of the sensor body 48a. To mount the photo sensor 48 on the circuit board 44, the terminals 57 are put through holes 44c of the circuit board 44 from the print side 44a. Thereafter, the terminals 57 are bent toward the circuit board 44, to be inserted from the mounting side 44b into another pair of holes 44d of the circuit board 44. Tips of the terminals 57 that are protruded from the print side 44a are soldered to the printed circuits made of copper foil. Thereby, the photo sensor 48 is secured to the circuit board 44, and also connected to the exposure control circuit, with its photoreceptive surface 56 oriented forward. The photoreceptive surface 56 is exposed through the photometric window 16 of the front cover 6, so the photo sensor 48 may measure subject brightness.

The exposure control circuit activates the electromagnet 35 to attract and hold the stop blade 27 at the second position when a subject brightness measured through the photo sensor 48 is below a predetermined level. In the second position, the large aperture 27a is placed on the optical axis of the taking lens 36.

Figure 4:
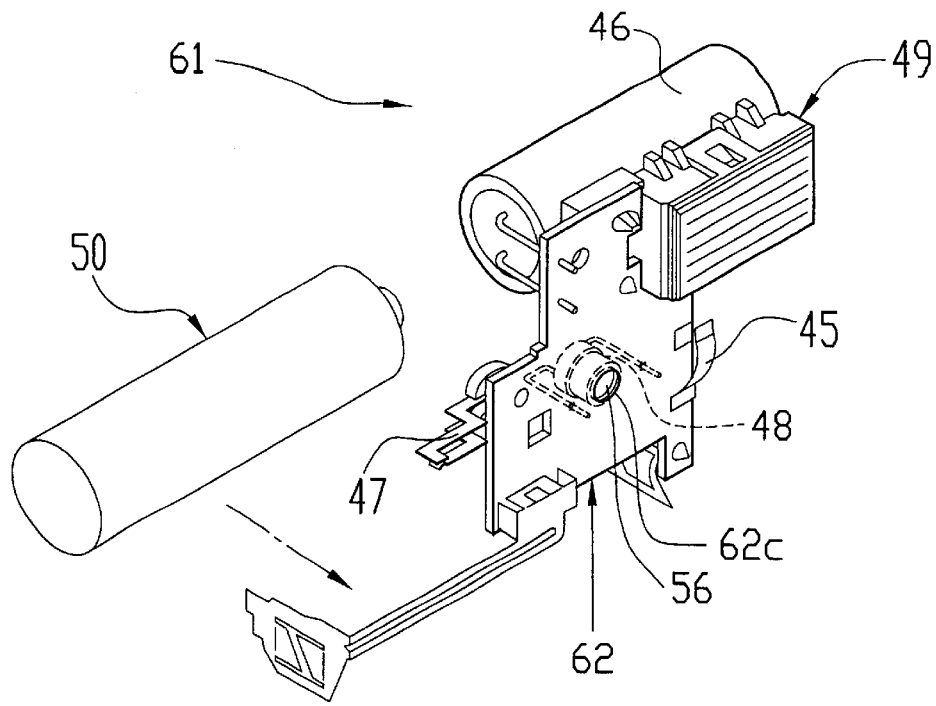
FIG. 4 is a perspective view of a flash device having a photo sensor mounted thereon according to a second embodiment of the invention.
Figure 5:
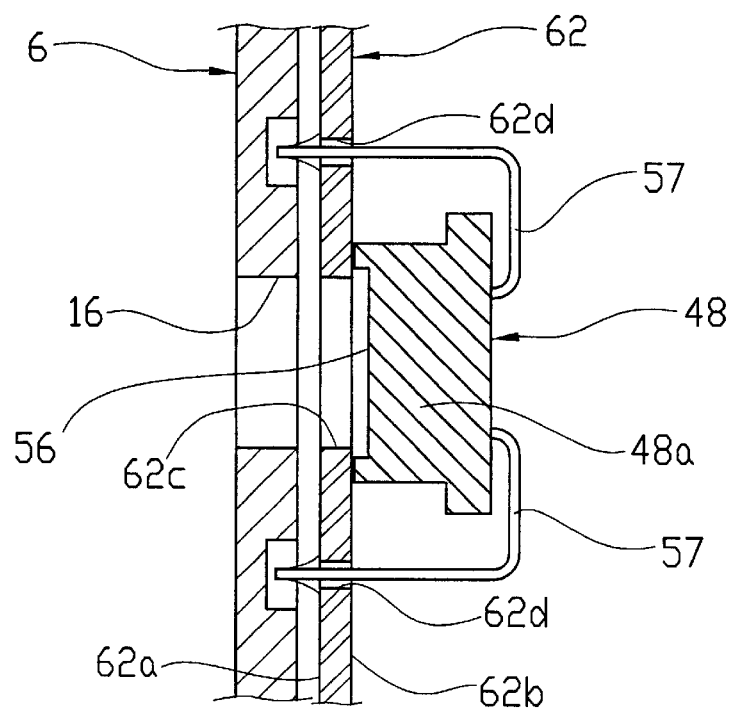
FIG. 5 is an enlarged sectional view of the photo sensor of the second embodiment.

According to a second embodiment shown in FIG. 4 and 5, an opening 62c is formed through a circuit board 62 of a flash device 61 in alignment with the photometric window 16. The photo sensor 48 is put on a mounting side 62b of the circuit board 62, with its photoreceptive surface 56 located behind the opening 62c, and the terminals 57 are bent toward the circuit board 62 and put through holes 62d of the circuit board 62 from the mounting side 62b to a print side 62a. The tips of the terminals 57 that are protruded from the print side 62a are soldered to printed circuits on the print side 62a. According to this embodiment, the photoreceptive surface 56 is exposed through the opening 62c of the circuit board 62 and the photometric window 16 of the front cover 6, so the photo sensor 48 may measure subject brightness. Since the photo sensor 48 is mounted on the rear mounting side 62b of the circuit board 62, the front cover 6 and the circuit board 62 may be located close to each other. Other configuration may be equivalent to those shown in the above embodiment, so the following description of the second embodiment will relate to only those features essential for the second embodiment.

Figure 6:
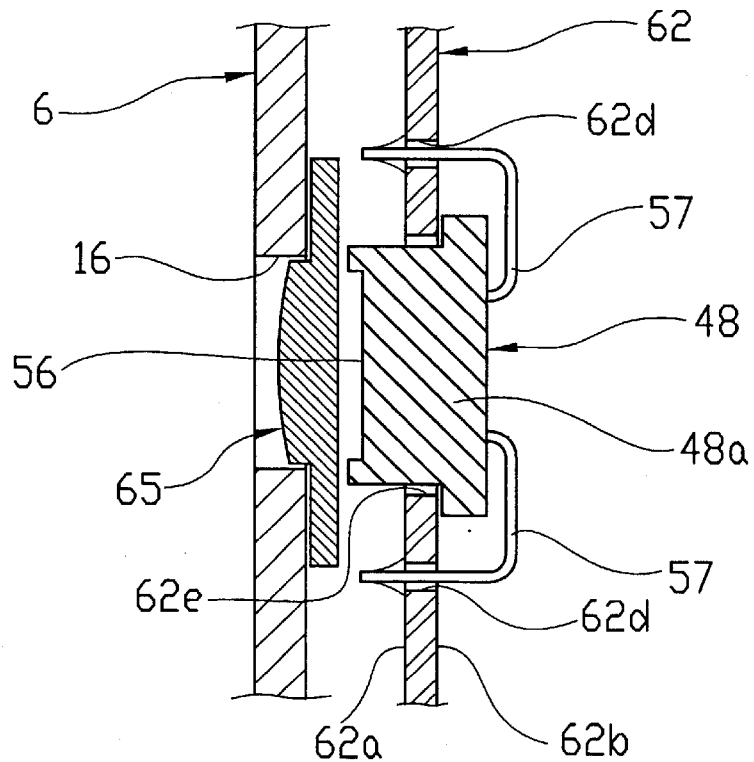
FIG. 6 is an enlarged sectional view of a photometric device consisting of a photo sensor and a converging lens, according to a third embodiment of the invention.
Figure 7:
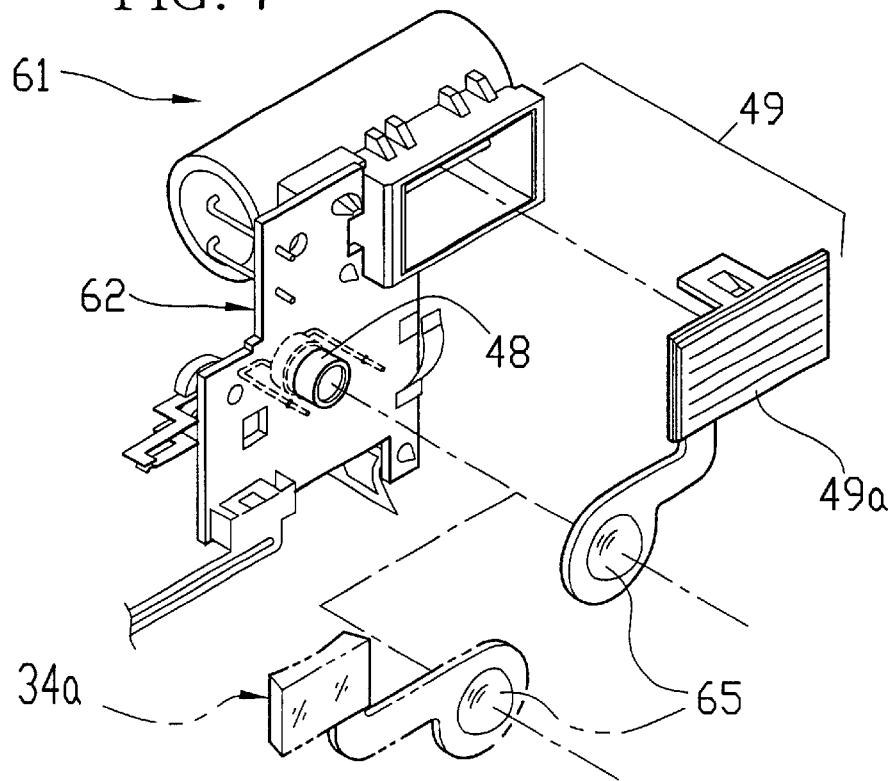
FIG. 7 is an exploded perspective view of a flash device with the photometric device of the third embodiment.

According to a third embodiment shown in FIG. 6, the circuit board 62 is provided with a hole 62e of a diameter that is equal to or slightly larger than the external diameter of the cylindrical sensor body 48a of the photo sensor 48, so the sensor body 48a may be fitted in the hole 62e, with its photoreceptive surface 56 protruded forward from the front print side 62a. Thereafter, the terminals 57 are inserted into the holes 62d and soldered to the printed circuit in the same way as the second embodiment. Thereby, the photo sensor 48 is more stably mounted on the circuit board 62.

It is also possible to dispose a converging lens 65 in front of the photoreceptive surface 56, so that the subject brightness may be measured in a wider photometric area. The converging lens 65 is held between the photoreceptive surface 56 and the photometric window 16. To reduce the number of parts as well as the number of assembling processes, it is preferable to form the converging lens 65 integrally with an objective lens of the finder optical system 34, or with a transparent plastic protector or diffusion plate 49a of the flash projector 49, or other transparent plastic member of the film unit 1.

Figure 8:
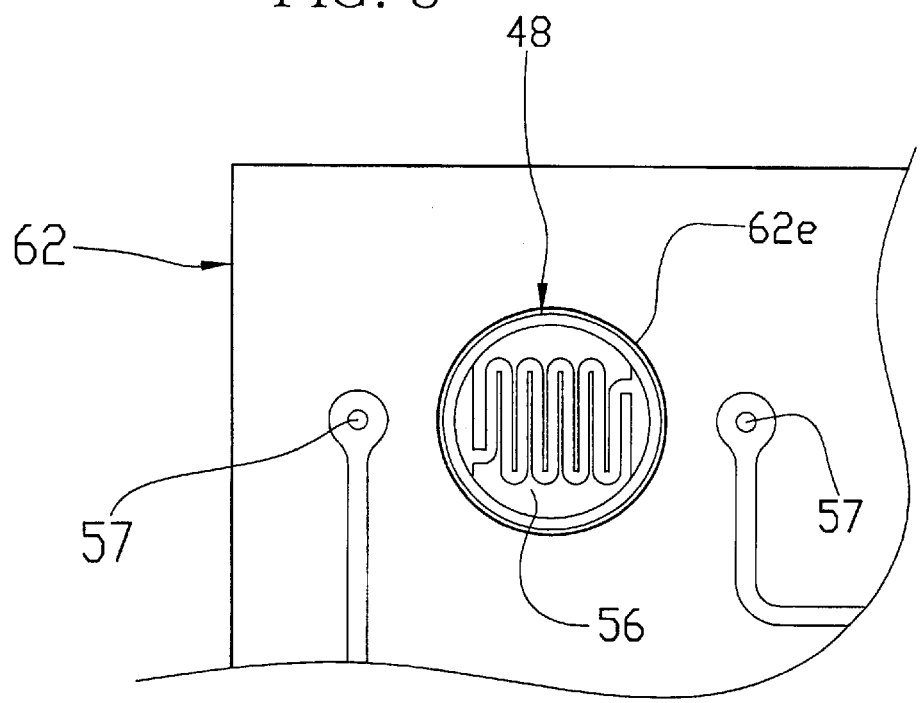
FIG. 8 is an enlarged front view of the photo sensor of the third embodiment.
Figure 9:
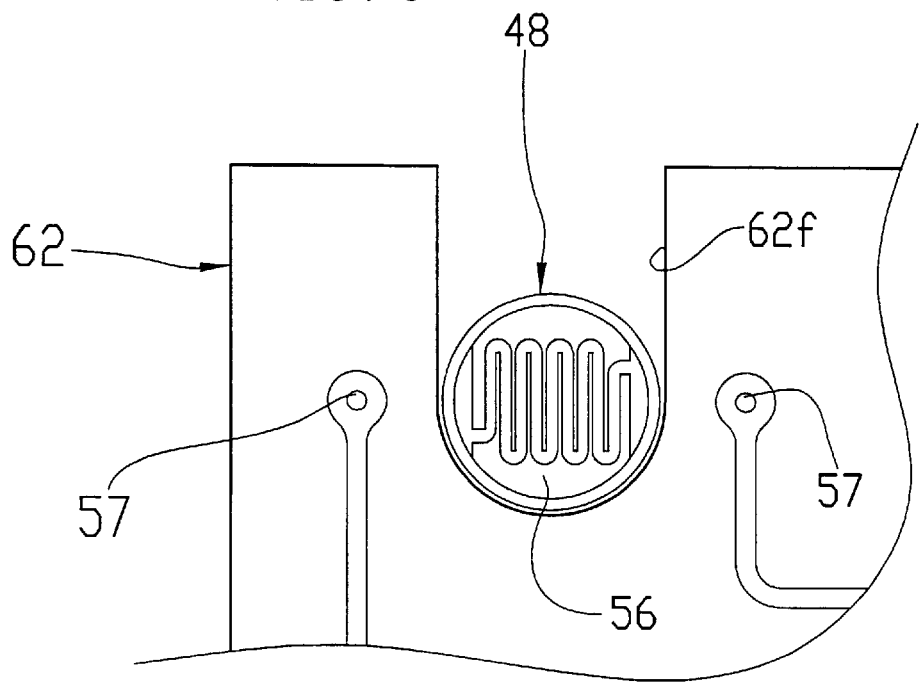
FIG. 9 is an enlarged front view of a photo sensor exposed to the front of a flash circuit board through a cutout, according to a fourth embodiment of the invention.

Although the circuit board 62 is provided with the hole 62e for exposing the photoreceptive surface 56 of the photo sensor 48 to the front side 62a in the third embodiment, as shown in FIG. 8, it is possible to provide a cutout 62f instead of the hole 62e, as shown in FIG. 9.

Although the photo sensor 48 has been described as a member of an automatic exposure control device of a film unit in the above embodiment, the method of mounting the photo sensor of the present invention is applicable to those cases where a photo sensor is used for another purpose, for example, for automatic-flashing, i.e., for causing a flash device to flash automatically when the subject brightness is below a predetermined level.

Figure 10:
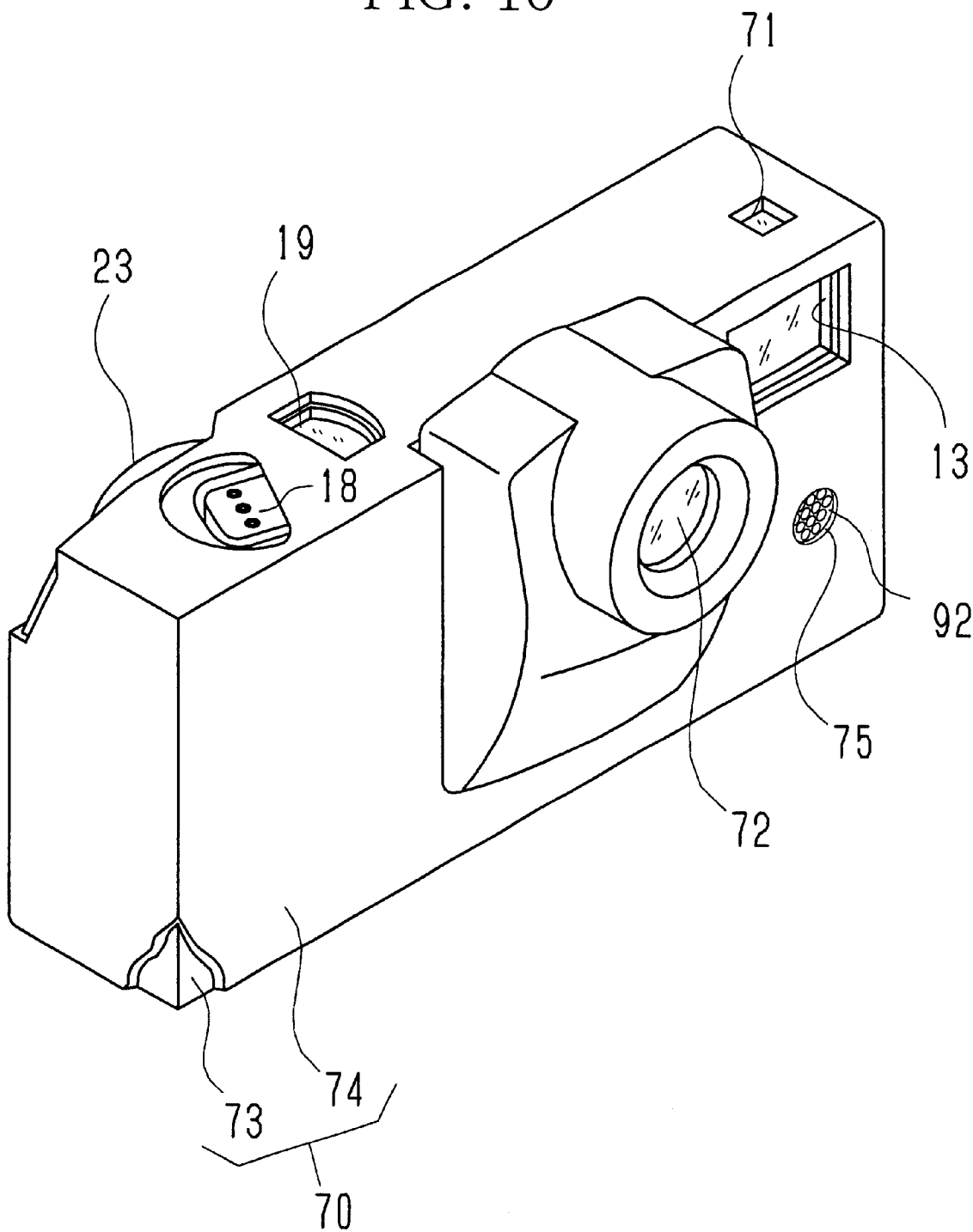
FIG. 10 is a perspective view of a telephoto type film unit with a photometric device according to a fifth embodiment of the invention.
Figure 11:
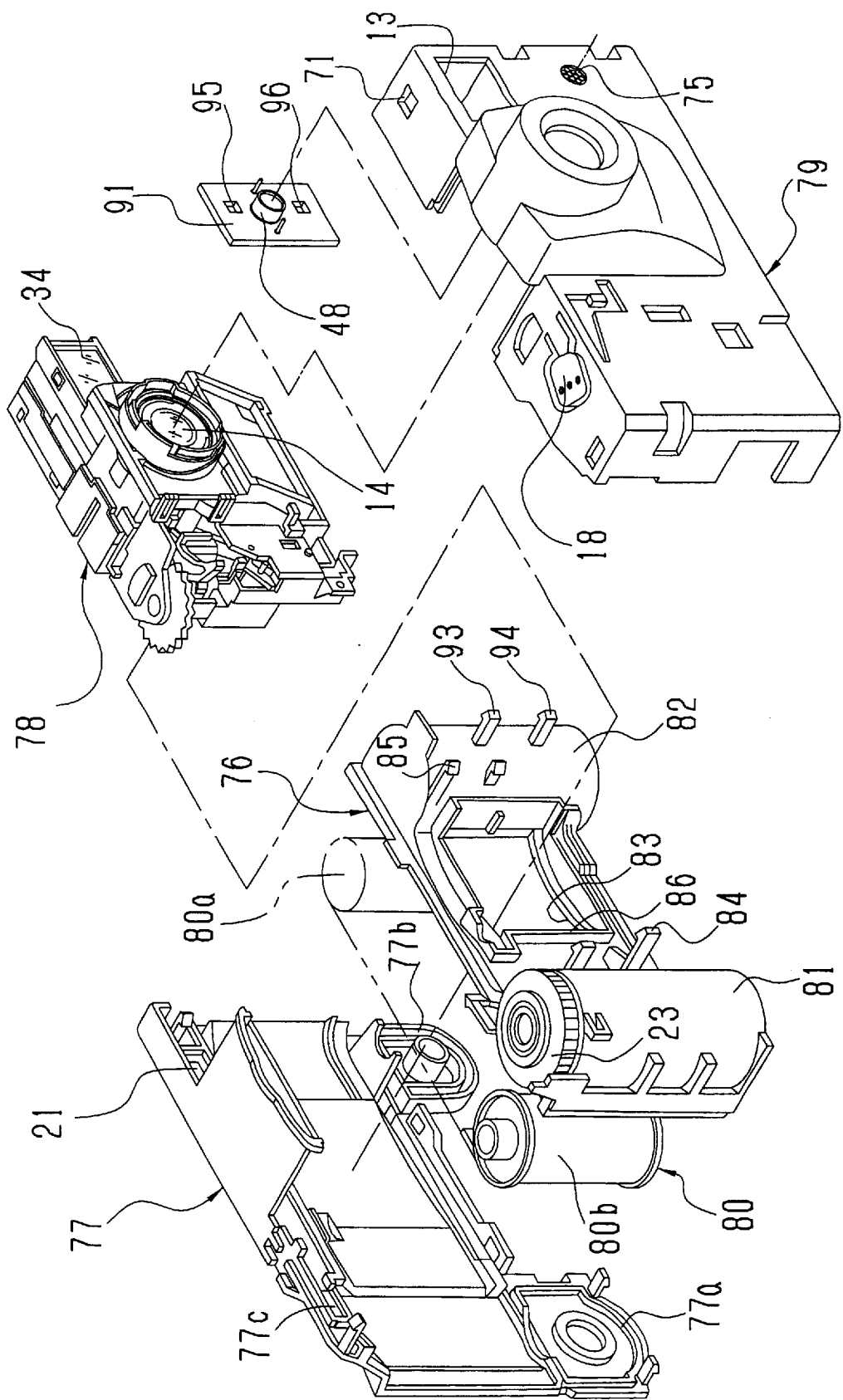
FIG. 11 is an exploded perspective view of the film unit of FIG. 9.

FIGS. 10 and 11 show a telephoto type film unit 70, wherein an optical warning signal is given through a low brightness warning window 71 when a subject brightness measured through a photometric window 75 is below a predetermined level. The low brightness warning window 71 is formed above a finder objective window 13 that is located on the right side of a taking lens 72 in FIG. 10. The taking lens 72 has a focal length of 120 mm, and is protruded forward to provide a long exposure light path from the taking lens 72 to a film surface in correspondence with the long focal length. A unit body 73 of the film unit 70 is encased in a casing 74 that has openings for exposing the finder objective window 13, the photometric window 75, the low brightness warning window 71, the taking lens 72, a shutter button 18, a frame counter window 19, a film winding wheel 23 and a finder eyepiece window 21 (see FIG. 11).

The unit body 73 is fundamentally constituted of a body basic portion 76, a rear cover 77, a photographic unit 78, and a front cover 79. In this embodiment, the body basic portion 76 holds a cartridge shell 80b and a roll of unexposed photo filmstrip 80a of an ISO 135-type photo film cartridge 80 in its cartridge chamber 81 and film chamber 82. The filmstrip 80a is a high speed film, e.g. ISO 800.

The rear cover 77 is attached to the body basic portion 76 to close the rear side of the body basic portion 76 in a light-tight fashion. Open bottoms of the cartridge chamber 81 and the film chamber 82 are closed by bottom lids 77a and 77b of the rear cover 77 in a light-tight fashion, and the film winding wheel 23 is partly protruded out through a slot 77c of the rear cover 77c.

The photographic unit 78 has the taking lens 72 and other necessary photographic mechanisms and a finder optical system 34 incorporated into one body in a way as disclosed in U.S. Pat. No. 5,628,039. The photographic unit 78 is attached to the front of an exposure aperture 83 through hooks 84 and 85 that are formed on the body basic portion 76. A forwardly protruding light-shielding rib 86 are formed around the exposure aperture 83.

Figure 12:
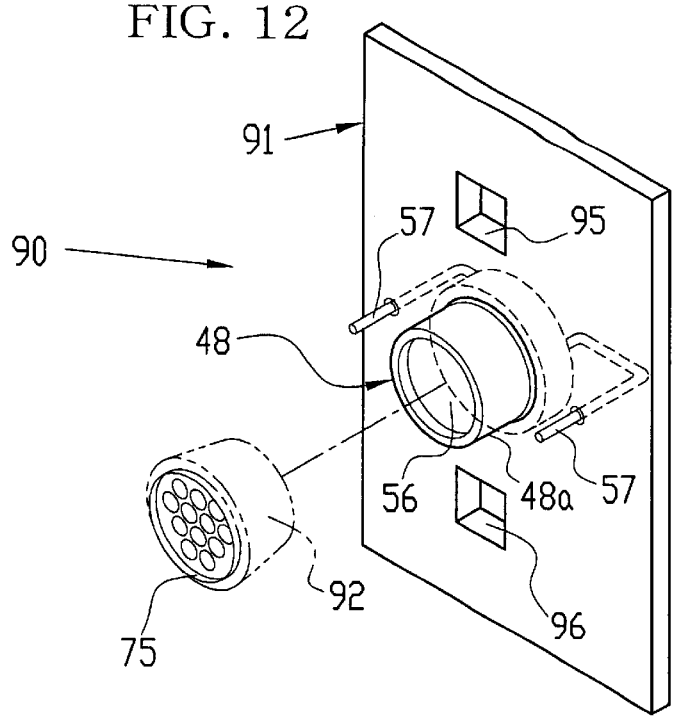
FIG. 12 is an exploded perspective view of the photometric device of the fifth embodiment.
Figure 13:
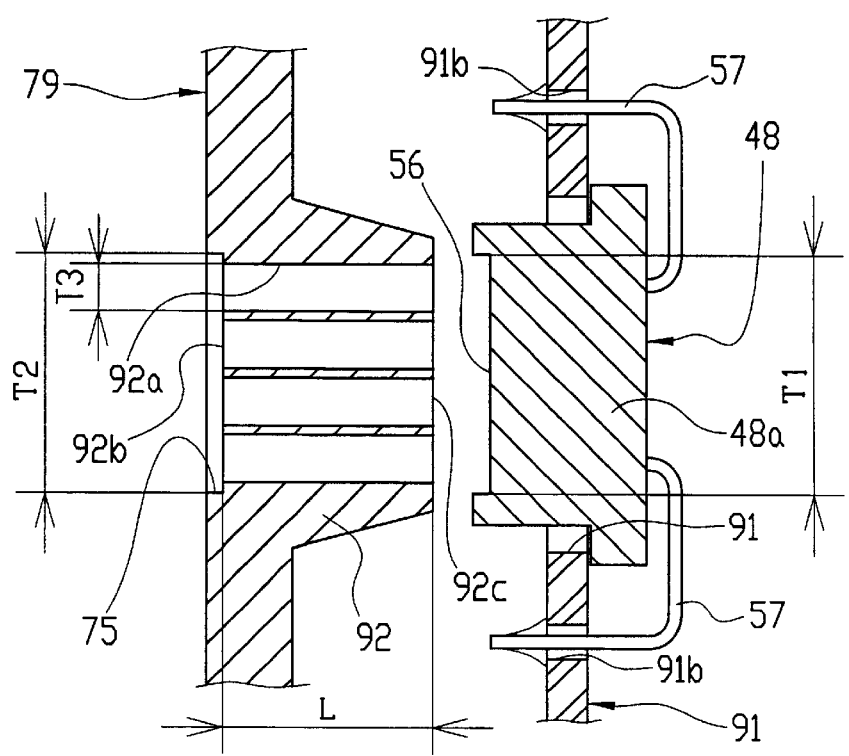
FIG. 13 is an enlarged sectional view of the photometric device of the fifth embodiment.

Besides the photographic unit 78, a photometric device 90 is provided in the telephoto type film unit 70. As shown in FIG. 12, the photometric device 90 consists of a circuit board 91, a photo sensor 48 mounted on the circuit board 91, and a mask member 92. The mask member 92 is formed behind the photometric window 75 integrally with the front cover 79, as shown in FIG. 13.

The circuit board 91 is attached to the front of the body basic portion 76 through engagement between engaging holes 95 and 96 of the circuit board 91 and hooks 93 and 94 that are formed on a front wall of the film chamber 82. In this embodiment, the photo sensor 48 is a CdS cell, consisting of a sensor body 48a, a photoreceptive surface 56 formed on a front face of the sensor body 48a, and a pair of terminals 57 protruding axially from a rear end of the sensor body 48a. The sensor body 48a is inserted with its photoreceptive surface 56 forward in a mounting opening 91a of the circuit board 91 from a rear side of the circuit board 91 in the mounted position,. The terminals 57 are bent toward the circuit board 91, and are put through mounting holes 91b of the circuit board 91. On a front side of the circuit board 91, there are printed a light measuring circuit and a light amount comparing circuit. Forwardly protruded tips of the terminals 57 are connected to the printed circuits by soldering. Although there are not-shown, an LED and a power source battery are mounted on the rear side of the circuit board 91, and are connected to the printed circuits.

The mask member 92 has a plurality of round holes 92a formed from its front surface 92b through its rear surface 92c in parallel to an optical axis of the taking lens 72. The front and rear surfaces 92b and 92c extend perpendicularly to the optical axis, and the front surface 92b is exposed through the photometric window 75. The photoreceptive surface 56 of the photo sensor 48 is located near behind the rear surface 92c in the mounting position, in parallel to the front and rear surfaces 92c. Thus, external light falls on the photoreceptive surface 56 only through the holes 92a of the mask member 92.

Figure 14:
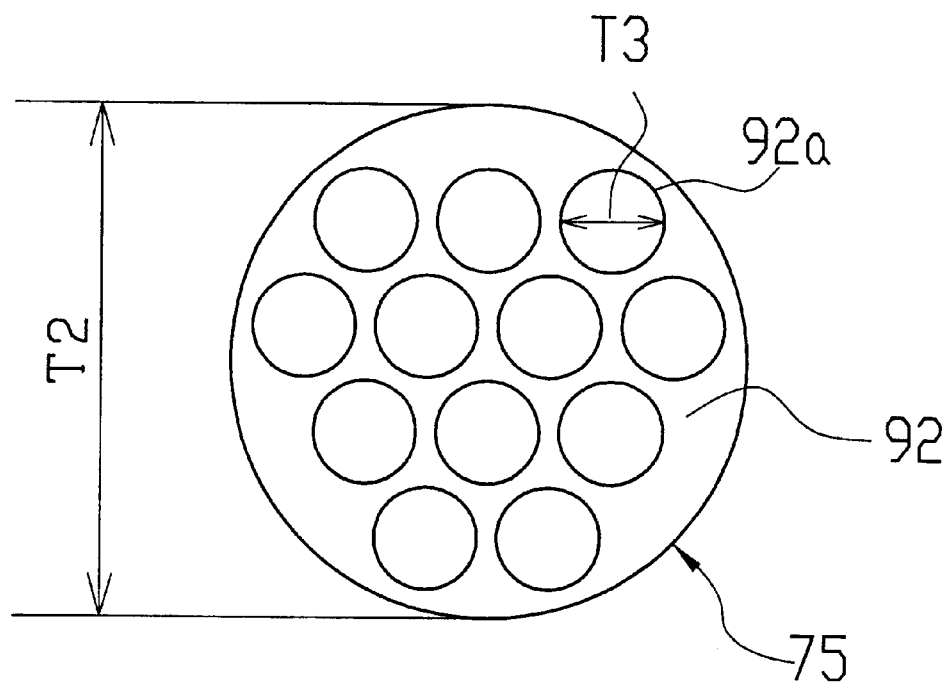
FIG. 14 is an explanatory diagram illustrating a mask member of the photometric device of the fifth embodiment.

The photometric window 75 has a diameter T2 that is equal to a diameter T1 of the photoreceptive surface 56 of the photo sensor 48, wherein T1=T2=6 mm in this embodiment. On the other hand, the round holes 92a has a diameter T3 of 1 mm, and a depth of 8 mm. That is, a length L from the front surface 92b to the rear surface 92c is 8 mm. There values are determined by the focal length of the taking lens 72, an effective frame size of the filmstrip 80a and a photometric area for measuring light value within a photographic field of the taking lens 72.

Where the diameter T3 is 1 mm and the length L is 8 mm, acceptance angle on the photoreceptive surface 56 through each hole 92a comes to be 7.125 degrees. Since the focal length of the taking lens 72 is 120 mm, and the effective frame size of the 135 type filmstrip 80a is 22.5 mm in the short side, the photometric area of the photo sensor 48 at this acceptance angle corresponds to an area that is ⅔ of the effective frame size. Since the sectional area of each hole 92a of 1 mm diameter is about 0.8 mm², the amount of light falling on the photoreceptive surface 56 through each individual hole 92a is very small. However, by providing a plurality of such holes 92a in front of the photoreceptive surface 56, the total amount of incident light becomes large enough for reliable detection of the subject brightness. In the present embodiment, twelve round holes 92a are formed in the photometric window 75 by arranging them closely in a honeycomb pattern, as shown in FIG. 14. Thereby, the total sectional area of these round holes 92a is about 9.4 mm².

The light measuring circuit outputs a light value signal representative of an amount of light falling on the photoreceptive surface 56 through these holes 92a, and the light amount comparing circuit compares the light value signal from the light measuring circuit with a value that is predetermined in accordance with the film speed of the filmstrip 80a, and activates the LED when the light value signal is below the predetermined value. The light from the LED is conducted through a not-shown light guide, and is projected out through the low brightness warning window 71. So the photographer may notice that the subject brightness is too low for the telephoto type film unit 70. Accordingly, the photometric device, the printed circuit, the LED, the light guide and the low brightness warning window 71 constitute a low brightness warning device.

Figure 15:
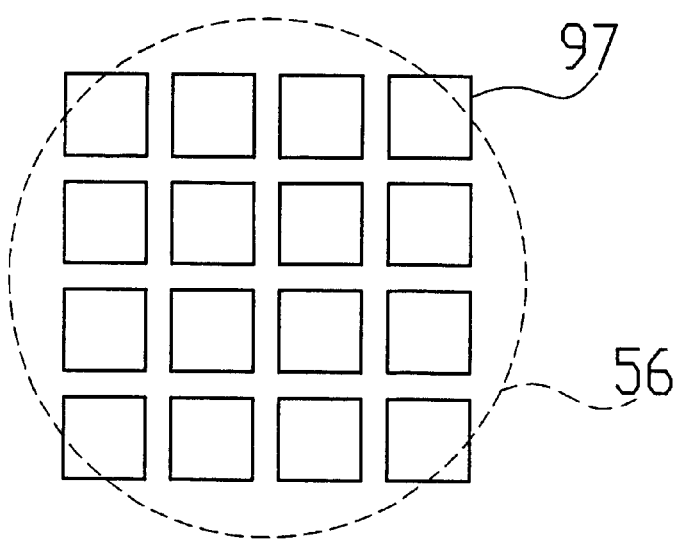
FIG. 15 is an explanatory diagram illustrating another embodiment of a mask member.

Although the mask member 92 of the above embodiment has the round holes 92a arranged in a honeycomb pattern, it is possible to use a mask member that has a plurality of rectangular holes 97 arranged in a matrix, as shown for example in FIG. 15. In that case, the diagonal length of the rectangular hole 97 is determined in relation to the axial length thereof to provide a predetermined acceptance angle. It is preferable to arrange the matrix of the rectangular holes 97 in a range whose aspect ratio is equal to that of the effective frame size, in order to make it easy to recognize the photometric area of the photo sensor 48. It is also possible to provide hexagonal or octagonal openings through the mask member.

Figure 16:
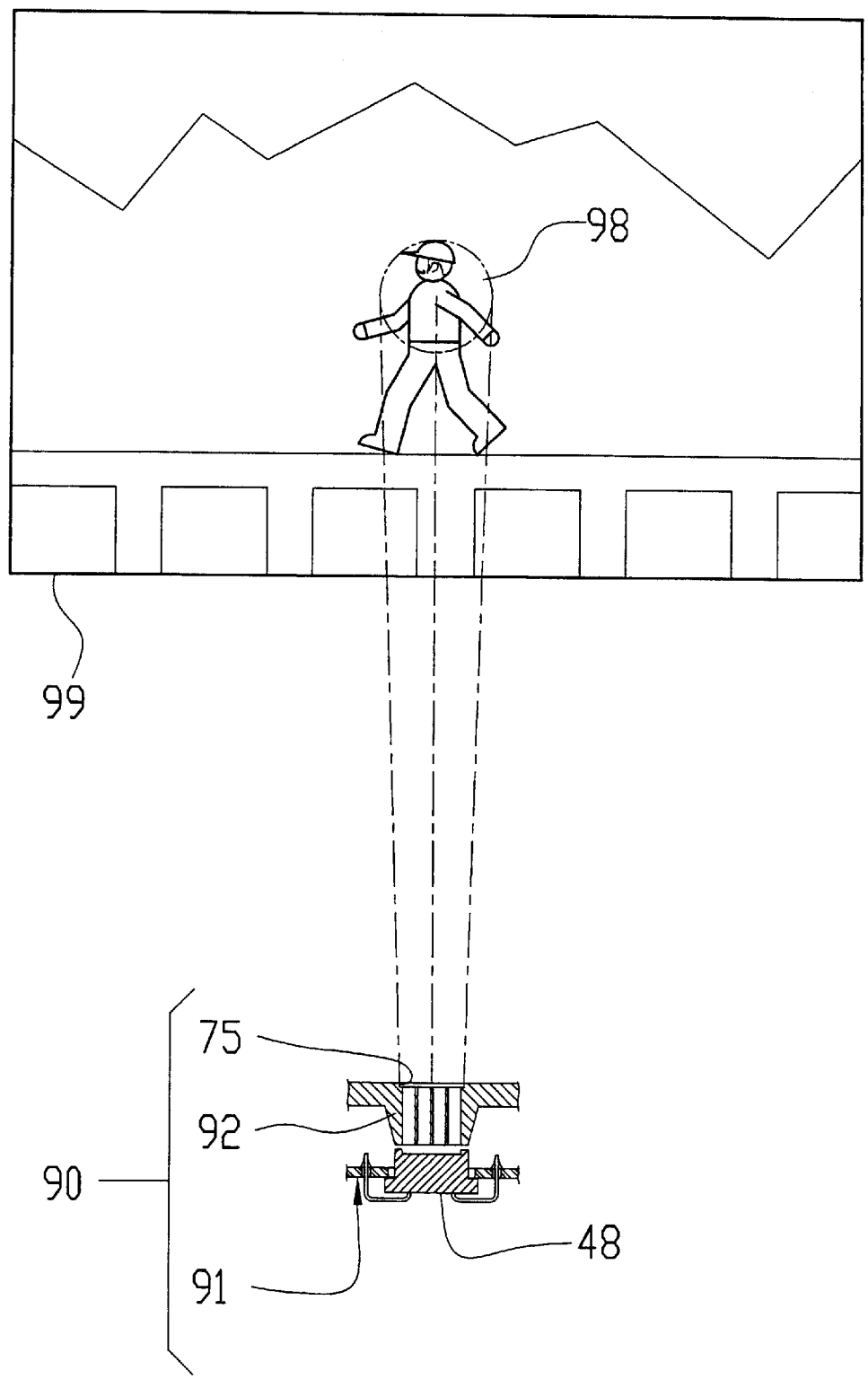
FIG. 16 is an explanatory diagram illustrating a relationship between a wide-angle photographic field and a spot photometric area, according to a sixth embodiment of the invention.

Although the photometric device 90 is used in the low brightness warning device of the telephoto type film unit in the above embodiment, the photometric device with the mask plate of the present invention may also be usable in a film unit of a standard focal length, for measuring light values in a spot, for instance in a center area 98 of a photographic field 99 of the standard film unit, as shown in FIG. 16. Assuming that the same photometric device 90 as used in the telephoto type film unit 70 is mounted in the standard film unit whose focal length is 32 mm, the spot 98 covered by the photometric device 90 corresponds to an area that is about ⅙ to ⅕ of an effective frame size of the 135 type filmstrip with respect to the short side length. Accordingly, as shown in FIG. 16, it is possible to measure the subject brightness in the center area 98 of the photographic field 99 of the standard film unit.

Although the present invention has been described with respect to the film units, the present invention is applicable not only to film units but also to compact cameras or other photographic devices.

Thus, the present invention is not to be limited to the above embodiments, but on the contrary, various modifications are possible to those skilled in the art without departing from the scope of claims appended hereto.

What is claimed is:

1. A photometric device for measuring subject brightness in a lens-fitted photo film unit with a flash device that includes a circuit board having printed circuits on a print side and circuit elements on a mounting side that is opposite to the print side, the circuit board being mounted in the film unit with its print side oriented toward an object side of a taking lens of the film unit, the photometric device comprising:

a light measuring circuit printed on the print side of the circuit board;

a photo sensor having a photoreceptive surface on its front face, and a pair of terminals extending rearward from the photo sensor, the photo sensor being put on the print side of the circuit board such that the terminals are put through the circuit board from the print side to the mounting side, and then bent toward the circuit board to be put through the circuit board from the mounting side to the print side, and tips of the terminals that protrude from the print side are soldered on the light measuring circuit; and a photometric window formed through a front cover of the film unit, for exposing the photoreceptive surface of the photo sensor.

2. A photometric device as claimed in claim 1, further comprising a converging lens that is formed integrally with a transparent plastic member of the film unit and is placed between the photometric window and the photoreceptive surface.

3. A photometric device as claimed in claim 1, wherein the photometric device is a member of an automatic exposure control device for switching an aperture size of the taking lens depending upon the subject brightness.

4. A photometric device for measuring subject brightness in a lens-fitted photo film unit with a flash device that includes a circuit board having printed circuits on a print side and circuit elements on a mounting side that is opposite to the print side, the circuit board being mounted in the film unit with its print side oriented toward an object side of a taking lens of the film unit, the photometric device comprising:

a light measuring circuit printed on the print side of the circuit board;

an opening formed through the circuit board;

a photo sensor having a photoreceptive surface on its front face, and a pair of terminals extending rearward from a rear end of the photo sensor, the photo sensor being mounted on the mounting side of the circuit board with its photoreceptive surface exposed through the opening to the print side, wherein the terminals are bent toward the circuit board and put through the circuit board from the mounting side to protrude tips of the terminals from the print side, and the tips of the terminals are soldered on the light measuring circuit;

a photometric window formed through a front cover of the film unit, for exposing the photoreceptive surface of the photo sensor.

5. A photometric device as claimed in claim 4, further comprising a converging lens that is formed integrally with a transparent plastic member of the film unit and is placed between the photometric window and the photoreceptive surface.

6. A photometric device as claimed in claim 4, wherein the photometric device is a member of an automatic exposure control device for switching an aperture size of the taking lens depending upon the subject brightness.

7. A photometric device comprising:

a photo sensor having a photoreceptive surface;

a photometric window formed in front of the photoreceptive surface; and a mask member provided between the photometric window and the photoreceptive surface, with a constant thickness in an axial direction perpendicular to the photoreceptive surface, the mask member having a plurality of smaller holes than the photoreceptive surface that are formed through from a front side that is exposed through the photometric window to a rear side that is opposed to the photoreceptive surface.

8. A photometric device as claimed in claim 7, wherein the holes extend in the axial direction, and the holes have a diameter or a diagonal length that is less than the thickness of the mask member.

9. A photometric device as claimed in claim 8, wherein the holes are arranged closely in a honeycomb pattern.

10. A photometric device for measuring subject brightness in a camera, comprising:

a photo sensor having a photoreceptive surface that is oriented toward an object side of a taking lens of the camera and extends perpendicularly to an optical axis of the taking lens;

a photometric window formed integrally with a front wall of the camera in front of the photoreceptive surface; and a mask member formed behind the photometric window integrally with the front wall, the mask member having a plurality of smaller holes than the photoreceptive surface that are formed through from a front side that is exposed through the photometric window to a rear side that is opposed to the photoreceptive surface, wherein the holes extend in the axial direction of the taking lens and have a diameter or a diagonal length that is less than an axial length of the holes.

11. A photometric device as claimed in claim 10, wherein the diameter or diagonal length and the axial length of the holes are determined to make an acceptance angle on the photoreceptive surface smaller than an angle of view of the taking lens.

12. A photometric device as claimed in claim 11, wherein the camera is a telephoto type lens-fitted photo film unit whose taking lens has a focal length of 120 mm.

13. A photometric device as claimed in claim 11, wherein the camera is a lens-fitted photo film unit whose taking lens has a focal length of 32 mm, and the acceptance angle is determined such that the photometric device measures the subject brightness in a spot within a photographic field of the taking lens.

* * * * *

UNITED STATES PATENT AND TRADEMARK OFFICE
CERTIFICATE OF CORRECTION

PATENT NO.      : 6,480,682 B1                                          Page 1 of 1
DATED           : November 12, 2002
INVENTOR(S)     : Kazuo Kamata It is certified that error appears in the above-identified patent and that said Letters Patent is hereby corrected as shown below:

<u>Title page,</u>
Item [30], amend to read as follows:
-- [30]  Foreign Application Priority Data
Sep. 3, 1999     (JP) ...............................11-250490
Sep. 29, 1999    (JP) ...............................11-277235 --.

Signed and Sealed this

Twenty-fifth Day of February, 2003

JAMES E. ROGAN
*Director of the United States Patent and Trademark Office*